United States Patent [19]
Emori et al.

[11] Patent Number: 4,568,892
[45] Date of Patent: Feb. 4, 1986

[54] FM MODULATOR USING AN OSCILLATING FEEDBACK CIRCUIT

[75] Inventors: Takahisa Emori; Masafumi Kikuchi, both of Kanagawa, Japan

[73] Assignee: Sony Corporation, Tokyo, Japan

[21] Appl. No.: 591,979

[22] Filed: Mar. 21, 1984

[30] Foreign Application Priority Data

Mar. 22, 1983 [JP] Japan .................. 58-47665

[51] Int. Cl.⁴ .................................... H03C 3/02
[52] U.S. Cl. .................................... 332/22; 331/135; 332/23 R
[58] Field of Search .................. 332/16 R, 22, 23 R, 332/16 T; 455/42, 110; 331/135

[56] References Cited
U.S. PATENT DOCUMENTS

4,459,566 7/1984 Lane .................. 332/23 R

*Primary Examiner*—Siegfried H. Grimm
*Attorney, Agent, or Firm*—Lewis H. Eslinger; Alvin Sinderbrand

[57] ABSTRACT

A frequency modulating circuit for modulating a carrier signal by a modulating signal is disclosed which includes a band-pass filter of biquad type having a first integrating circuit and a second integrating circuit, an output of the first integrating circuit being supplied to an input terminal of the second integrating circuit and an output of the second integrating circuit being supplied to an input terminal of the first integrating circuit and a second input terminal of the second integrating circuit, and a limiting amplifier circuit supplied with the output signal of the band-pass filter and the output thereof being positively fed back to the band-pass filter. In this case, the modulating signal is supplied to the first and second integrating circuits such that the center frequency of the band-pass filter is linearly controlled by the modulating signal whereby a frequency modulated signal modulated by the modulating signal is led out of the output terminal of the second integrating circuit.

5 Claims, 8 Drawing Figures

FIG. 1
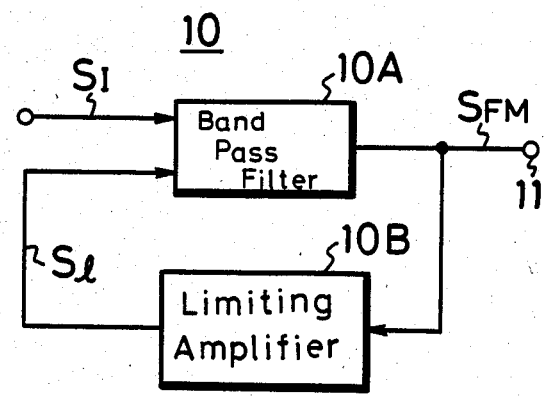
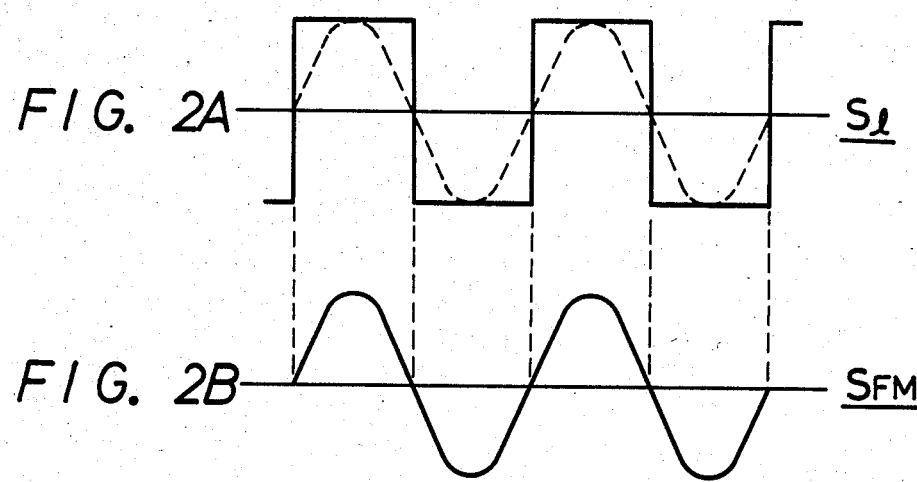

FM MODULATOR USING AN OSCILLATING FEEDBACK CIRCUIT

BACKGROUND OF THE INVENTION

1. Field of the Invention

The present invention relates generally to frequency modulating circuits and more particularly is directed to a frequency modulating circuit suitable for being used to frequency-modulate a carrier signal with an audio signal, a video signal or the like.

2. Description of the Prior Art

An angle modulating circuit may be used as, for example, a frequency-modulating circuit for audio signals in a magnetic recording and reproducing apparatus or the like in which an audio signal, for example, is angle-modulated on a carrier signal, then recorded together with a video signal by a rotary magnetic head and then reproduced. It is desired that such frequency modulating circuit be used which has an output with a low distortion, reduced high frequency components and a large frequency deviation and which is suitable for being formed as an IC (integrated circuit).

As the frequency modulating circuit for frequency-modulating audio signals used in such magnetic recording and reproducing apparatus, there has been employed a frequency modulating circuit which is formed of oscillatory elements such as L, C, R (inductance coil, capacitor and resistor) and of an amplifier. Since this frequency modulating circuit produces an output signal with a sinusoidal waveform, it provides the advantage that the frequency-modulated signal therefrom is low in distortion. On the other hand, since the center frequency thereof is varied by a variable capacitor and also the frequency vs. capacitance change characteristic of the variable capacitor is non-linear, there is a defect in that it is impossible to increase the frequency deviation width relative to the center frequency. In addition, the degree of modulation thereof can not be raised.

On the other hand, a frequency modulating circuit employing a multivibrator carries out the frequency modulation by using the charging and discharging of its capacitor so that the modulated frequency-frequency deviation characteristic becoms linear, and thus the frequency deviation width is increased. However, since the output from this frequency modulating circuit is of a square waveform, it contains much higher harmonic components. As a result, the FM occupied band width is wide. In addition, since it is necessary for such frequency modulating circuit to use a capacitor of relatively large capacitance, the construction of the above frequency modulating circuit is not suitable for being formed as an IC.

OBJECTS AND SUMMARY OF THE INVENTION

Accordingly, it is an object of the present invention to provide an improved frequency modulating circuit.

It is another object of the present invention to provide a frequency modulating circuit which can produce an output of low distortion and a large frequency deviation width.

It is a further object of the present invention to provide a frequency modulating circuit which is suitable for being formed as an IC (integrated circuit).

It is a still further object of the present invention to provide a frequency modulating circuit which is quite suitable for use with a magnetic recording and reproducing apparatus for a television signal.

According to one aspect of the present invention, there is provided an integrated frequency modulating circuit for modulating a carrier signal by a modulating signal comprising:

(A) a band-pass filter of biquad type having a first integrating circuit and a second integrating circuit, an output of said first integrating circuit being supplied to an input terminal of said second integrating circuit and an output of said second integrating circuit being supplied to an input terminal of said first integrating circuit and said input terminal of said second integrating circuit;

(B) a limiting amplifier circuit directly supplied with the output signal of said band-pass filter, the output thereof being positively fed back to said band-pass filter; and (C) means for supplying said modulating signal to said first and second integrating circuits such that the center frequency of said band-pass filter is linearly controlled by said modulating signal whereby a frequency modulated signal modulated by said modulating signal is led out of the output terminal of said second integrating circuit.

The other objects, features and advantages of the present invention will become apparent from the following description taken in conjunction with the accompanying drawings throughout which like references designate the same elements and parts.

BRIEF DESCRIPTION OF THE DRAWINGS

FIG. 1 is a diagram for explaining the principle of the frequency modulating circuit according to the present invention;

FIGS. 2A and 2B are respectively waveform diagrams useful for explaining the operation thereof;

DESCRIPTION OF THE PREFERRED EMBODIMENTS

Figure 3:
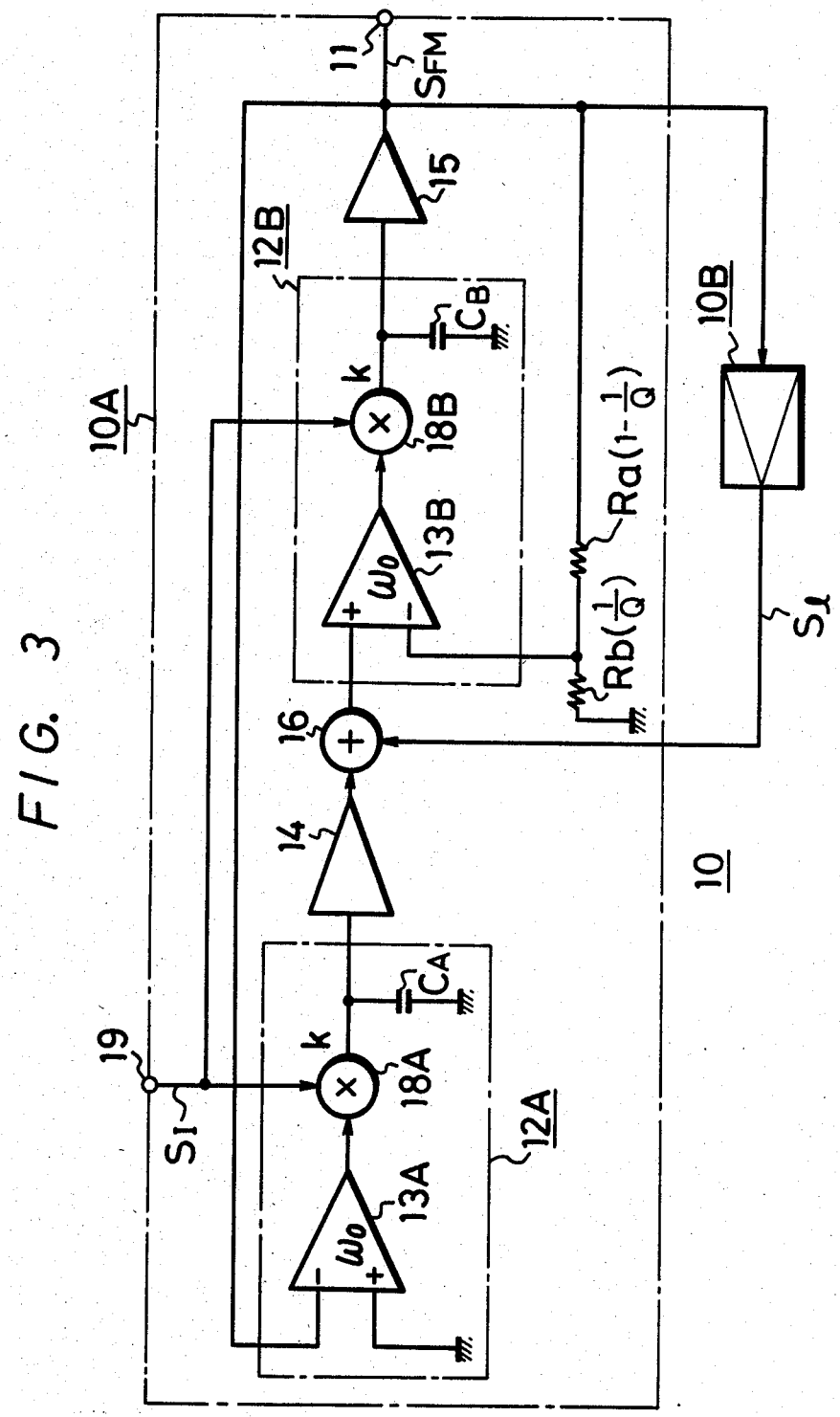
FIGS. 3 and 4 are respectively systematic block diagrams showing first and second embodiments of the frequency modulating circuit according to the present invention.

The frequency modulating circuit according to the present invention will hereinafter be described in detail with reference to the drawings. In this case, the present invention is embodied in apparatus in which an audio signal, for example, is frequency-modulated on a carrier signal.

FIG. 1 is a systematic block diagram showing a frequency modulating circuit 10 according to the present invention. Reference numeral 10A designates a band-pass filter the center frequency of which can be varied linearly and 10B a limiting amplifier. The output from the band-pass filter 10A is supplied to the limiting amplifier 10B the output of which is positively fed back to the band-pass filter 10A.

If the loop gain of the feedback loop for the band-pass filter 10A is selected to be higher than 1, an oscillation is generated therethrough. Accordingly, if a modulating signal $S_I$ is supplied to the band-pass filter 10A to change the center frequency thereof, the oscillation is generated through the loop at the changed center frequency. Thus, at a terminal 11 there is produced an FM (frequency modulated) signal. Since limiting amplifier 10B is employed in this case, the stability of amplitude is excellent and the loop gain is large, and the frequency response is excellent.

FIGS. 2A and 2B show an example of a signal waveform of the circuit shown in FIG. 1 upon non-modulation. The limiting amplifier 10B produces an output $S_I$ shown in FIG. 2A, while the band-pass filter 10A produces a signal $S_{FM}$ which is a fundamental wave component of the output $S_I$ shown in FIG. 2B.

As the band-pass filter the center frequency of which can be varied linearly, the present invention uses a band-pass filter of biquad type which is improved to be a frequency variable type.

FIG. 3 shows an example of the band-pass filter 10A of the biquad type which is constructed with a pair of integrating circuits 12A and 12B. The first integrating circuit 12A is formed mainly of a differential amplifier 13A and a charge and discharge capacitor $C_A$, while the second integrating circuit 12B is similarly formed of a differential amplifier 13B and a capacitor $C_B$. The first and second integrating circuits 12A and 12B are connected in cascade as shown in FIG. 3.

In this case, an amplifier 14 is interposed between the integrating circuits 12A and 12B, while an amplifier 15 is interposed between the second integrating circuit 12B and the output terminal 11. A part of the output developed at the terminal 11 is fed back to the first integrating circuit 12A and the part thereof is further fed back to the second integrating circuit 12B through a resistor Ra. On the other hand, a resistor Rb is connected between the connection point of the resistor Ra with the differential amplifier 13B and ground to form a voltage divider, whereby it becomes possible to set the sharpness or quality factor Q of the band-pass filter 10A by the ratio between the resistance values of the resistors Rb and Ra.

Between the amplifier 14 and the input stage of the second integrating circuit 12B is connected an adder 16 to which the limited output $S_I$ from the limiting amplifier 10B is supplied.

In this example of the present invention, multipliers 18A, 18B are respectively connected between the differential amplifiers 13A, 13B and the capacitors $C_A$ and $C_B$ constituting the first and second integrating circuits 12A, 12B, to which the modulating signal $S_I$ is supplied through a terminal 19.

The pair of resistors Ra, Rb connected to the second integrating circuit 12B are used to adjust the negative feedback of the FM signal $S_{FM}$ which is developed at the output terminal 11.

Since, in the band-pass filter 10A formed as set forth above, the FM signal $S_{FM}$ developed at the output terminal 11 is fed back to the first and second integrating circuits 12A and 12B, respectively, the transfer function H(S) of the band-pass filter 10A is expressed as $$H(S) = \frac{H_0 \cdot \frac{k\omega_0}{Q} \cdot S}{S^2 + \frac{k\omega_0}{Q} S + (k\omega_0)^2} \quad (1)$$

where $k\omega_0$ is the center angular frequency, k the multiplication coefficient, $\omega_0$ the center angular frequency upon non-modulation, Q the sharpness or quality factor of the filter 10A and $H_0$ the gains of the differential amplifiers 13A and 13B when the feedback loop is not provided.

Since the multiplication coefficient k designates the level of the modulating signal $S_I$ which is supplied to the terminal 19, the center angular frequency $\omega_0$ of the band-pass filter 10A is changed from $\omega_0$ to $k\omega_0$ by the modulating signal $S_I$. When $\omega = k\omega_0$, input and output waveforms of the filter 10A are in phase. Thus, the band-pass filter 10A oscillates at $\omega = k\omega_0$.

As a result, the center angular frequency $\omega_0$ of the band-pass filter 10A is shifted in frequency by the modulating signal $S_I$. In other words, the center angular frequency $\omega_0$ thereof is frequency-modulated by the modulating signal $S_I$.

In this case, since the FM signal $S_{FM}$ developed at the output terminal 11 has the sinusoidal waveform shown in FIG. 2B, the FM signal $S_{FM}$ contains no higher harmonic components and is therefore output with less distortion. Further, since both the capacitors $C_A$, $C_B$ provided in the integrating circuits 12A, 12B are of small capacitance, the frequency modulating circuit 10 itself can be formed as an IC (integrated circuit).

Moreover, since the pair of integrating circuits 12A, 12B provided in the band-pass filter 10A both operate linearly, the frequency deviation in this band-pass filter 10A has a linear characteristic as long as the multipliers 18A, 18B operate linearly. The pair of multipliers 18A, 18B can both be constructed so as to have the linear characteristic so that the frequency deviation width $\Delta f$ of the band-pass filter 10A is changed linearly by the modulating signal $S_I$. Thus, it is possible to make the frequency deviation width $\Delta f$ larger than ever.

For example, when the center frequency $f_0$ is about 200 kHz, the frequency deviation width $\Delta f$ can be made approximately $\pm 75$ kHz by controlling the multiplication coefficient k.

Figure 4:
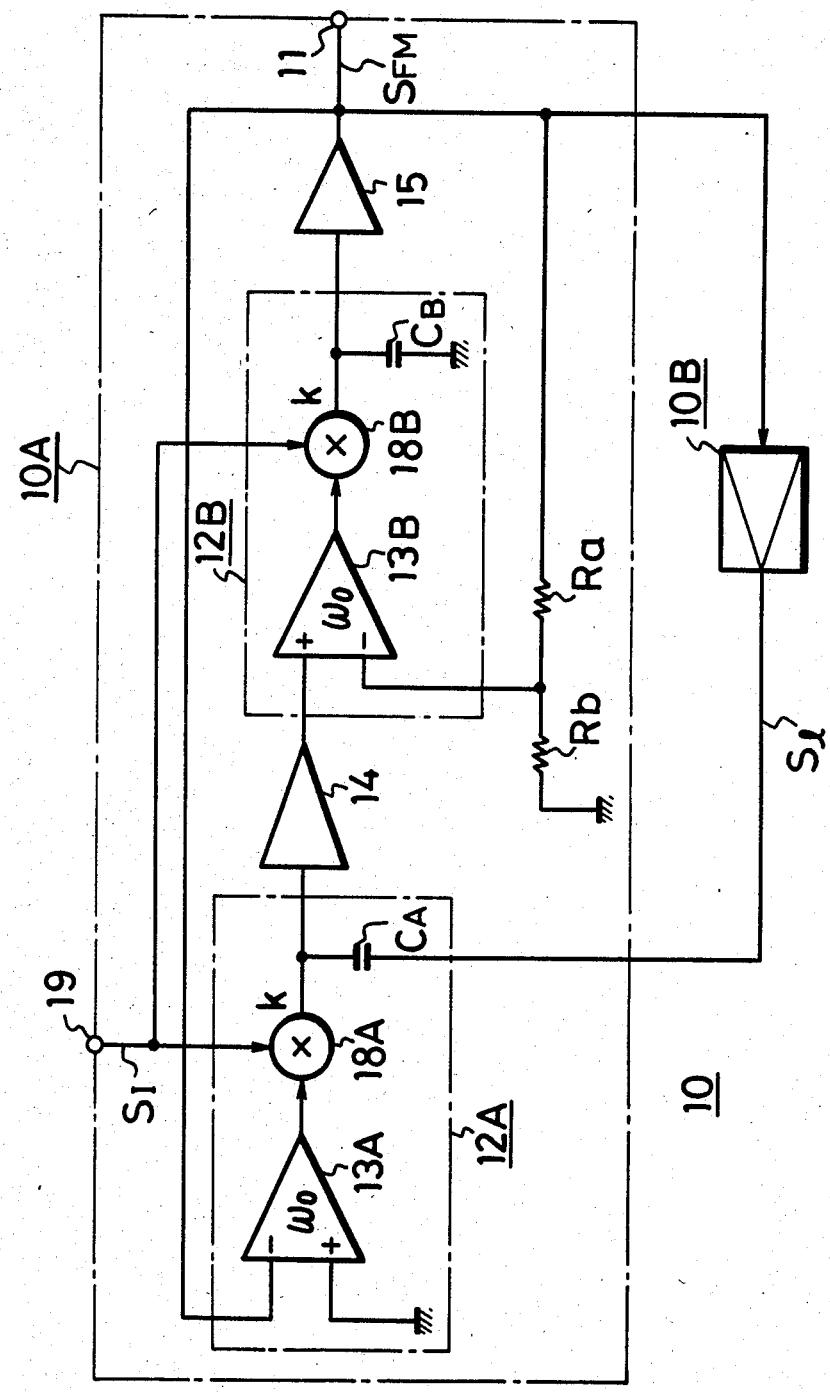

FIG. 4 shows another embodiment of the frequency modulating circuit according to the present invention. In FIG. 4, like parts corresponding to those in FIG. 3 are marked with the same references and will not be described in detail. While in the embodiment of FIG. 3, the limited output $S_I$ from the limiting amplifier 10B is added at the adder 16, in the embodiment shown in FIG. 4 the adder 16 is omitted, but instead the limited output $S_I$ is directly supplied to the cold side, that is, the side connected to ground in the first embodiment of FIG. 3, of the charging/discharging capacitor $C_A$ provided in the first integrating circuit 12A. With this arrangement, the same effect as that in FIG. 3 can be achieved.

According to the frequency modulating circuit 10 of the present invention, the FM signal $S_{FM}$ therefrom has less amplitude distortion and its frequency deviation width $\Delta f$ can be made large. Also, this frequency modulating circuit 10 can easily be formed as an IC so that the frequency modulating circuit 10 of the present invention is suitable for use as an FM oscillator in the above magnetic recording and reproducing apparatus.

Figure 5:
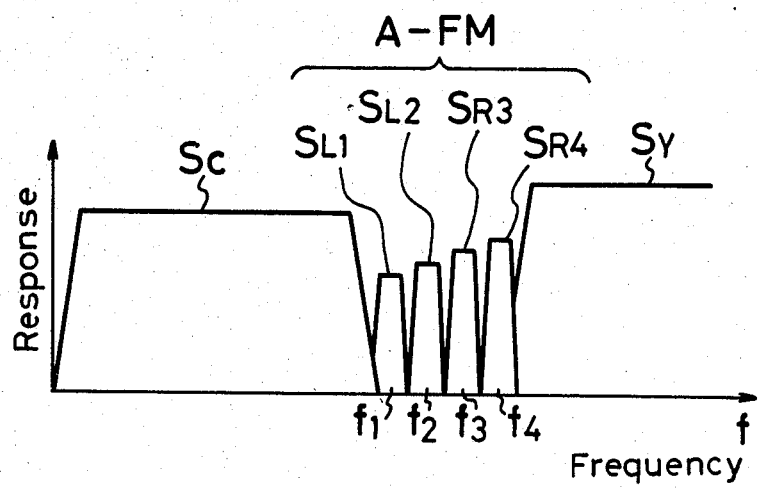
FIGS. 5 and 6 are respectively diagrams showing an example of a signal recording system to which the present invention is appropriately applied.

When an audio signal is frequency-modulated and then recorded together with a video signal by using a rotary magnetic head, as, for example, shown in FIG. 5, a frequency-modulated audio signal A-FM is frequency-multiplexed between respective bands of a carrier chrominance signal $S_C$ converted into a low frequency band and a frequency-modulated luminance signal $S_Y$. For example, left and right audio signals $S_L$ and $S_R$ are separated from each other and then frequency-modulated. Also, in order to reduce a zero beat problem caused by the crosstalk component between the adjoining channels, the FM audio signals recorded in the adjacent channels are made to have different carrier frequencies.

Figure 6:
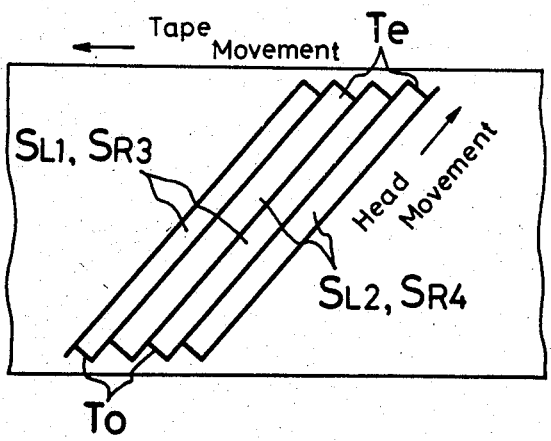

By way of example, carrier frequencies $f_1$, $f_2$ ($f_2=f_1+f_c$ where $f_c$ represents the frequency of, for example, 150 kHz) are frequency-modulated by the left audio signal $S_L$, while carrier frequencies $f_3$, $f_4$ ($f_3=f_2+f_c$ where $f_4=f_3+f_c$) are frequency-modulated by the right audio signal $S_R$. Then, as shown in FIG. 6, left and right FM audio signals $S_{L1}$ and $S_{R3}$ with the carrier frequencies $f_1$ and $f_3$ are respectively recorded on a certain track $T_0$, while left and right FM audio signals $S_{L2}$, $S_{R4}$ with the carrier frequencies $f_2$ and $f_4$ are respectively recorded on next track $T_e$.

Consequently, when the FM audio signal is recorded in a frequency range between the bands of the carrier chrominance signal $S_C$ and the luminance signal $S_Y$ as described above, if the FM carrier is distorted, the higher harmonic component thereof is mixed into another audio signal component so that there is the probability that the S/N (signal-to-noise) ratio is deteriorated. If a modulation index m is large, such probability becomes significant. Therefore, when the FM audio signal is superimposed upon the narrow band described as above, it is desirable to use the frequency modulated output from the present apparatus as set forth above.

Figure 7:
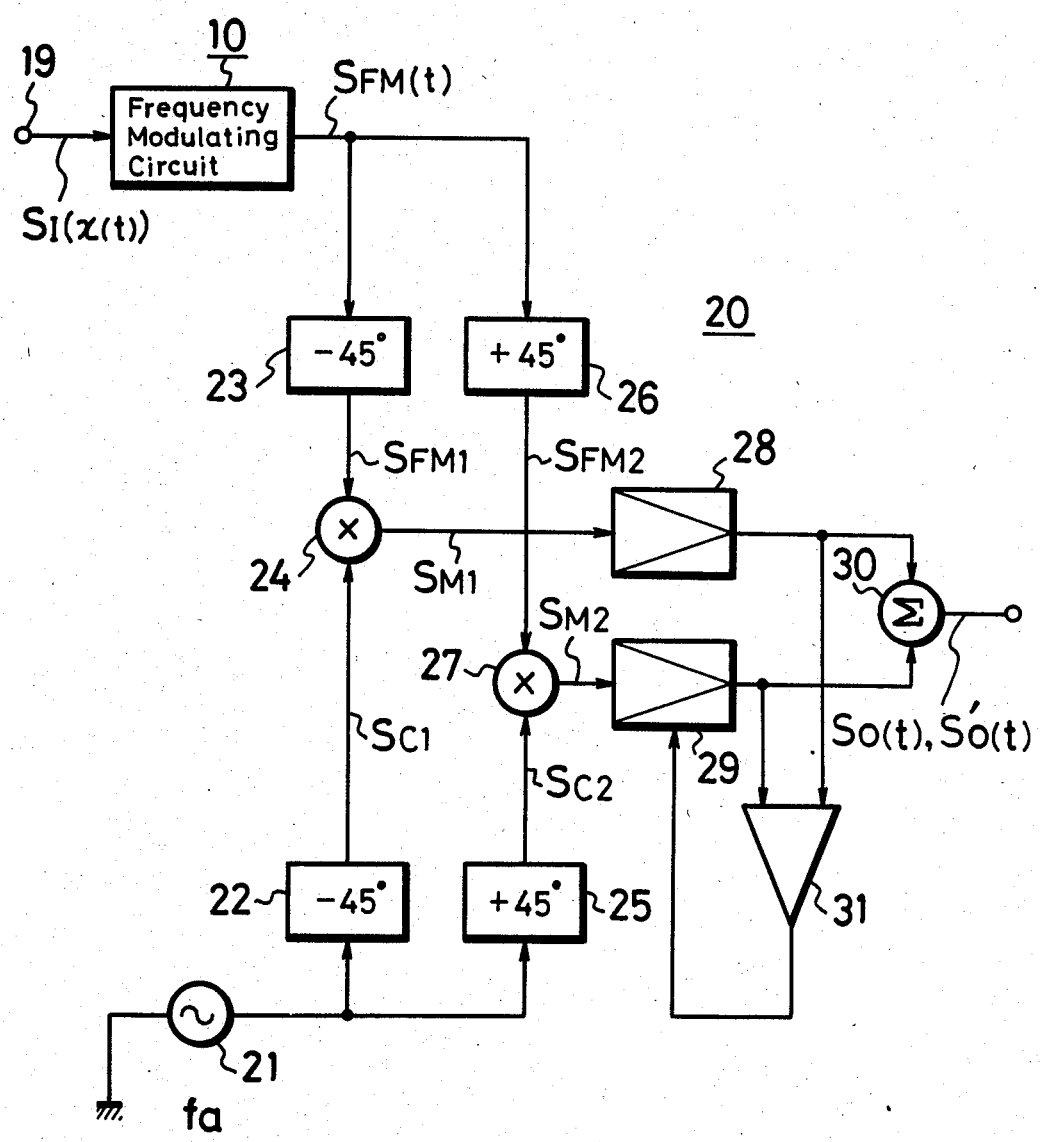
FIG. 7 is a block diagram showing an example of a signal converting circuit.

In such case, when the center frequency $f_0$ of the frequency modulating circuit 10 is selected as the above carrier frequencies $f_1$ to $f_4$ (1.0 MHz or above), the frequency deviation width $\Delta f$ thereof is about $\pm 75$ kHz, which is quite low for the center frequencies $f_1$ to $f_4$ so that the changing ratio of the frequency deviation relative to the carrier frequency is small. Therefore, in such case, if the FM audio signal is frequency-modulated at low frequencies and then frequency-converted to the center frequencies $f_1$ to $f_4$, the design of the entire circuit becomes easier. FIG. 7 shows an exeample of such a case.

Since the frequency interval in each of the carrier frequencies $f_1$ to $f_4$ is about 150 kHz as mentioned above, this example employs a heterodyne system to produce the carrier frequencies $f_1$ to $f_4$ to thereby form the FM audio signals $S_{L1}$ to $S_{R4}$. FIG. 7 is a practical example of a circuit forming the FM audio signals $S_{L1}$ and $S_{L2}$.

FIG. 7 shows an example of a frequency converting circuit 20 in which an oscillator 21 is used to convert the frequency. The frequency $f_a$ of the oscillator 21 is determined so as to make a relation between the frequency $f_a$ and the center frequency $f_0$ of the frequency modulating circuit 10 be expressed as follows:

$$f_a-f_0=f_1, \quad f_a+f_0=f_2$$

The output from the oscillator 21 and the output from the frequency modulating circuit 10 are respectively supplied through $-45°$ phase shifters 22 and 23 to a multiplier 24. Similarly, the output from the oscillator 21 and the output from the frequency modulating circuit 10 are respectively supplied through $+45°$ phase shifters 25 and 26 to a multiplier 27 thereby being respectively multiplied with each other.

The multiplied outputs from the first and second multipliers 24 and 27 are respectively supplied through amplifiers 28 and 29 to a composer 30.

Reference numeral 31 designates a level detecting circuit which receives the outputs from the amplifiers 28 and 29 and then generates an AGC (automatic gain control) voltage. In this example, the gain of the amplifier 29 is controlled by the AGC voltage such that the second multiplied output becomes equal in magnitude to the first multiplied output.

The operation of the signal converting circuit 20 will now be described. If the modulating input is taken as $x(t)$ and the center frequency of the frequency modulating circuit 10 is taken as $f_0 (=(\omega_0/2\pi))$, the FM signal of the sine waveform is expressed by the following equation.

$$S_{FM}(t) = \sin\left\{\omega_0 t + m \cdot \int_0^t x(\tau)d\tau\right\} = A(t)\sin\omega_0 t + B(t)\cos\omega_0 t \tag{2}$$

where $$A(t) = \cos\left\{m \cdot \int_0^t x(\tau)d\tau\right\}, \quad B(t) = \sin\left\{m \cdot \int_0^t x(\tau)d\tau\right\}$$

When the above FM signal is passed through the $\pm\pi/4$ phase shifters 23 and 26 respectively, the FM signal becomes signals $F_{FM1}$ and $S_{FM2}$ which are expressed as follows:

$$S_{FM2} = A(t)\sin\left(\omega_0 t + \frac{\pi}{4}\right) + B(t)\cos\left(\omega_0 t + \frac{\pi}{4}\right) \tag{3}$$

$$S_{FM1} = A(t)\sin\left(\omega_0 t - \frac{\pi}{4}\right) + B(t)\cos\left(\omega_0 t - \frac{\pi}{4}\right) \tag{4}$$

When the oscillatory frequency $f_a (=(\omega_a/2\pi))$ is passed through the phase shifters 22 and 25 respectively, it becomes $S_{C1}$ and $S_{C2}$ which are respectively expressed as follows:

$$S_{C2} = \sin\left(\omega_a t + \frac{\pi}{4}\right) \tag{5}$$

$$S_{C1} = \sin\left(\omega_a t - \frac{\pi}{4}\right) \tag{6}$$

If the FM signals $S_{FM2}$ and $S_{FM1}$ are respectively subjected to modulation at the multipliers 24 and 27, the multiplier 27 produces an output $S_{M2}$ which is expressed by $$S_{M2} = \frac{A(t)}{2}\{\cos(\omega_a - \omega_0)t + \sin(\omega_a + \omega_0)t\} + \frac{B(t)}{2}\{\cos(\omega_a + \omega_0)t + \sin(\omega_a - \omega_0)t\} \tag{7}$$

and the multiplier 24 produces an output $S_{M1}$ expressed by $$S_{M1} = \frac{A(t)}{2}\{\cos(\omega_a - \omega_0)t - \sin(\omega_a + \omega_0)t\} + \tag{8}$$

-continued $$\frac{B(t)}{2}\{-\cos(\omega_a + \omega_0)t + \sin(\omega_a - \omega_0)t\}$$

Therefore, when $S_{M1} \pm S_{M2}$ are carried out in the composer 30, the addition yields $$S_0(t) = A(t) \cos (\omega_a - \omega_0)t + B(t) \sin (\omega_a - \omega_0)t = \quad (9)$$

$$\cos\left\{(\omega_a - \omega_0)t + m \cdot \int_0^t x(\tau)d\tau\right\}$$

while, the subtraction yields $$S'_0(t) = A(t) \sin (\omega_a + \omega_0)t + B(t) \cos (\omega_a + \omega_0)t = \quad (10)$$

$$\sin\left\{(\omega_a + \omega_0)t + m \cdot \int_0^t x(\tau)d\tau\right\}$$

The center frequency of the equation (9) is $f_1$, and the center frequency of the equation (10) is $f_2$. The center frequencies $f_3$ and $f_4$ can be obtained by a similar method.

As described above, the addition and subtraction in the composer 30 yield the audio signals $S_{L1}$ and $S_{L2}$ the carrier frequencies of which are frequency-converted to $f_1$ or $f_2$. Since the other audio signals are similarly formed, they will not be described.

According to the above frequency conversion with a heterodyne system, the frequency modulating circuit 10 having excellent linearity is used so that it is possible to provide an FM audio signal which has reduced higher harmonic components and hence is stable. As a result, since the signal converting circuit does not require a filter for limiting the band or the like, it is possible to effectively prevent the characteristic of the waveform from being deteriorated.

As set forth above, according to the present invention, since the FM signal of sinusoidal waveform can be obtained by using the band-pass filter 10A of biquad type and the limiting amplifier 10B, it is possible to provide a frequency modulating circuit with low distortion and large frequency deviation width and which is suitable for being formed as an integrated circuit. Consequently, the frequency modulating circuit according to the present invention is quite suitable for use with a magnetic recording and reproducing apparatus which includes the above signal converting system.

The above description is given on the preferred embodiments of the invention, but it will be apparent that many modifications and variations could be effected by one skilled in the art without departing from the spirit or scope of the novel concepts of the invention, so that the scope of the invention should be determined by the appended claims only.

We claim as our invention:

1. An integrated frequency modulating circuit for modulating a carrier signal by a modulating signal to provide a frequency modulated output signal having a large frequency deviation comprising:
    band-pass filter means of biquad type including a first integrating circuit having an input terminal and an output, a second integrating circuit having first and second input terminals and an output terminal providing an output, and feedback means including means for determining a quality factor of said band-pass filter means;
    said output of said first integrating circuit being supplied to said first input terminal of said second integrating circuit, and said output of said second integrating circuit being supplied to said input terminal of said first integrating circuit and through said feedback means also to said second input terminal of said second integrating circuit means;
    means for supplying said modulating signal to said first and second integrating circuits such that a center frequency of said band-pass filter means is controlled in response thereto, said frequency modulated output signal with a large frequency deviation being provided at said output terminal of said second integrating circuit; and
    limiting amplifier circuit means directly supplied with said frequency modulated output signal and having an output positively fed back to at least one of said first and second integrating circuits.

2. A frequency modulating circuit according to claim 1, wherein each of said first and second integrating circuits includes an amplifier, a multiplier and a capacitor, and said modulating signal is supplied to said multiplier.

3. A frequency modulating circuit according to claim 1, wherein said limiting amplifier circuit means is connected between the output terminal and the first input terminal of said second integrating circuit.

4. A frequency modulating circuit according to claim 2, wherein said limiting amplifier circuit means is connected between the output terminal of said second integrating circuit and a cold terminal of the capacitor of said first integrating circuit.

5. A frequency modulating circuit according to claim 1, wherein said feedback means includes a voltage divider; and an output signal of said voltage divider is supplied to the second input terminal of said second integrating circuit to determine said quality factor of said band-pass filter means by a dividing ratio of said voltage divider.

* * * * *